United States Patent
Lin

(10) Patent No.: US 7,582,396 B2
(45) Date of Patent: Sep. 1, 2009

(54) HYBRID PHASE-SHIFT MASK AND MANUFACTURING METHOD THEREOF

(75) Inventor: Tzu-Chang Lin, Taipei (TW)

(73) Assignee: Toppan Chunghwa Electronics Co., Ltd., Tao-Yuan (TW)

( * ) Notice: Subject to any disclaimer, the term of this patent is extended or adjusted under 35 U.S.C. 154(b) by 416 days.

(21) Appl. No.: 11/582,307

(22) Filed: Oct. 18, 2006

(65) Prior Publication Data

US 2007/0269722 A1    Nov. 22, 2007

(30) Foreign Application Priority Data

May 19, 2006  (TW) .............................. 95117972 A

(51) Int. Cl.
*G03F 1/00* (2006.01)
*G03C 5/00* (2006.01)

(52) U.S. Cl. .......................................... 430/5; 430/394

(58) Field of Classification Search ..................... 430/5, 430/394; 716/19, 20, 21; 250/492.22
See application file for complete search history.

(56) References Cited

U.S. PATENT DOCUMENTS

| 6,841,310 B2 * | 1/2005 | Dulman | 430/5 |
| 6,994,939 B1 * | 2/2006 | Ghandehari et al. | 430/5 |

* cited by examiner

*Primary Examiner*—Stephen Rosasco
(74) *Attorney, Agent, or Firm*—Stout, Uxa, Buyan & Mullins, LLP

(57) ABSTRACT

This invention discloses a hybrid phase-shift mask (PSM) having multi-film structure that from bottom to top is transparent film, attenuate film, and opaque film. By using several exposure and develop processes as well as controlling the etching selectivity, the multi-film structure can be patterned to form the chrome-less PSM and alternate PSM features within its cell area, and form halftone PSM features within its periphery area.

16 Claims, 5 Drawing Sheets

Peripheral Area 100    Cell Area 200

HYBRID PHASE-SHIFT MASK AND MANUFACTURING METHOD THEREOF

BACKGROUND OF THE INVENTION

1. Field of the Invention

The present invention relates to a mask and its manufacturing method, and more particularly, to a hybrid phase-shift mask and its manufacturing method.

2. Description of the Previous Technology

Because minimum linewidths have been shrinking, the resolution of the mask (photomask) must be enhanced. As a result, increasingly complex resolution enhancement techniques (RET), for example, off-axis illumination, phase-shift mask, and optical proximity correction, have been required to maintained adequate pattern fidelity. Of the RET, the phase-shift mask (PSM) is expected as a viable alternative. Many forms of PSM, such as alternate PSM, chrome-less PSM, and attenuated PSM, have been developed over the years. They are respectively suitable for specific pattern, and their ability to improve the resolution can be distinguished into strong PSM and weak PSM.

The mask is responsible for transferring the pattern to an underlying substrate. The smaller critical dimension of the substrate will cause the higher need in resolution. Because the substrate may have some region characterized by smaller critical dimension and some region characterized by larger critical dimension, one mask may need high and low-resolution part manufactured at same mask, for printing critical and non-critical features at the same time. For instance, a substrate, employed for liquid crystal display, a lot of alternate lines and spaces characterize its central region, and a lot of irregular lines or shapes, used for logical control, characterize its periphery region. Comparing the resolution-enhanced ability of the phase-shift masks, the alternate PSM and the chrome-less PSM are comparable, the alternate PSM and chrome-less PSM are stronger than the attenuated PSM, and the attenuated PSM is stronger than the Binary mask. The alternate PSM or chrome-less is suitable for patterning the shape of line and space, but not suitable for irregular shapes within the periphery region. In the context of manufacturing alternate PSM or chrome-less PSM masks, mask fabrication should meet process issues such as phase uniformity control and defect repair control, both of which can be challenging. The attenuated PSM can be used for both the line/space and irregular shapes of logical pattern. Nevertheless, if the line is critical, as in 0.14 µm, it will fail to reach the demand of resolution.

To improve the resolution, the advanced photolithography process can use two or more masks, such as one chrome-less PSM and one attenuated PSM, to expose the substrate two, even multiple times. Although this process enhanced the resolution, it also wastes time and higher process defect risk. A hybrid mask could be another solution. It has two different mask topography structures for patterning. Manufacturing a hybrid mask often needs more complex materials and consequently more films, therefore resulting in more steps and difficulty in the manufacturing process.

Accordingly, we need a hybrid phase-shift mask that allows for printing critical and non-critical features at one exposure process, and the manufacturing process of the hybrid mask can be simplified, for saving time and increasing yield.

SUMMARY OF THE INVENTION

An object of the present invention is to provide a hybrid phase-shift mask, for printing critical and non-critical features at one exposure process, and the manufacturing process of the hybrid mask can be simplified, for saving time and increasing yield.

According to the object, the present invention provides a phase-shift mask having a cell area and a periphery area, comprising a transparent film, an attenuated film arranged on the transparent film, and an opaque film arranged on the attenuated film. Within the cell area, the transparent film constitutes a plurality of first transparent regions; the trenches of the transparent film constitute a plurality of second transparent regions. Each of the second transparent regions is arranged between every two of the first transparent regions along the x-coordinate. In addition, the opaque film, attenuated film, and transparent film, following patterning, constitute a plurality of first shading regions. Each of the shading regions is arranged between every two of the first transparent regions along the y-coordinate.

Within the periphery area, the patterned attenuated film and transparent film constitute a plurality of third transparent regions. The patterned transparent film constitutes a plurality of fourth transparent regions.

Therefore, the first transparent region and second transparent region form the chrome-less PSM features in x-coordinate, and the first transparent region and first shading region B1 forms the alternate PSM in y-coordinate.

Accordingly, the present invention provides a method for manufacturing the hybrid phase-shift mask. A four-layer, multi-film construction—a transparent film, an attenuated film, an opaque film, and a resist film construct the blank—is provided as a basic material for manufacturing the hybrid phase-shift mask. By using multiple exposure, developing, and etching processes, and etching simultaneously the transparent film and attenuated film, controlling the etching rate, and controlling the etching selectivity properly, the manufacturing process can be simplified.

BRIEF DESCRIPTION OF THE DRAWINGS

FIG. 1A and FIG. 1B illustrate the hybrid phase-shift mask according to one embodiment of the present invention, wherein FIG. 1B shows a three-dimension view of the array region of FIG. 1A.

DESCRIPTION OF THE PREFERRED EMBODIMENT

The detailed description of the present invention will be discussed in the following embodiments, which are not intended to limit the scope of the present invention, but can be adapted for other applications. While drawings are illustrated in details, it is appreciated that the quantity of the disclosed components may be greater or less than that disclosed, except expressly restricting the amount of the components.

Figure 1A:
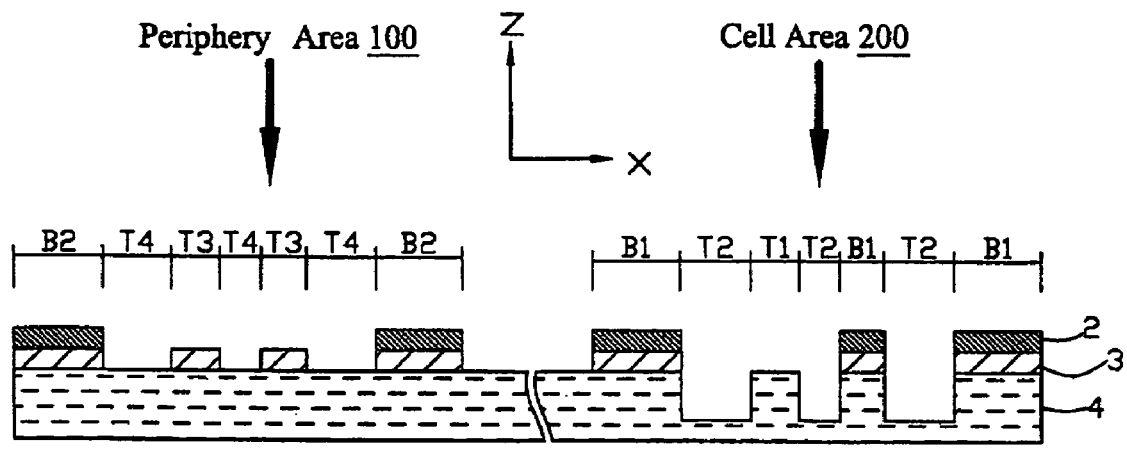
Figure 1B:
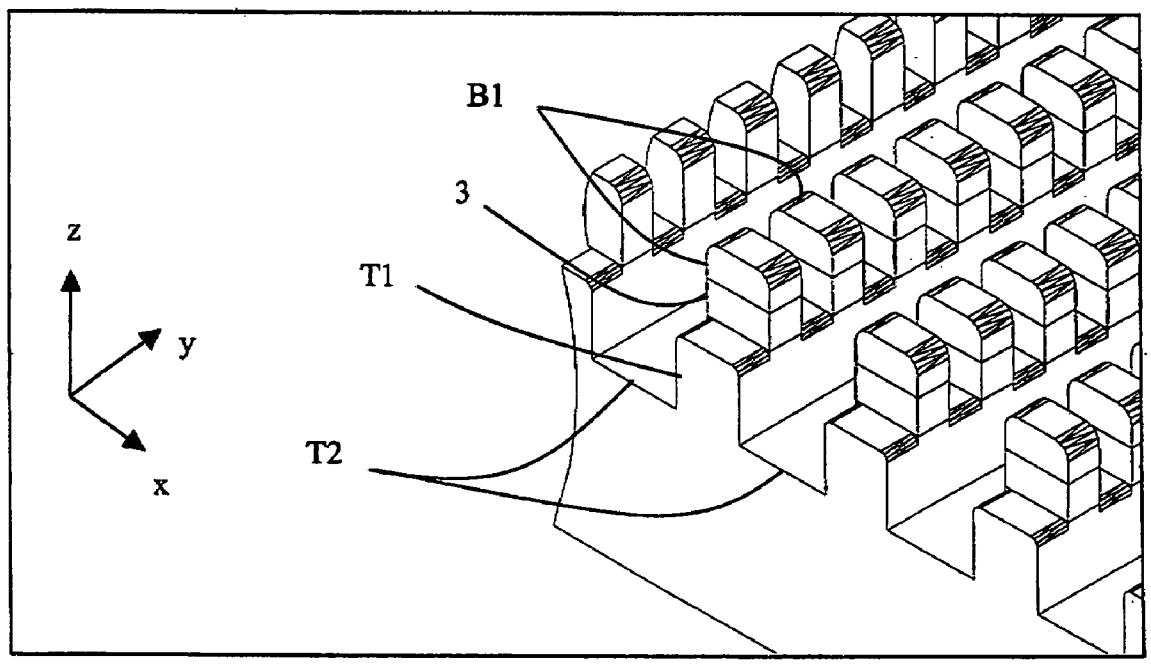

FIG. 1A and FIG. 1B briefly illustrate the structure of the hybrid phase-shift mask according to one embodiment of the present invention, wherein FIG. 1B shows a three-dimension view of the cell area of FIG. 1A. Along z-coordinate, three films, which comprise a transparent film 4, an attenuated film 3, and an opaque film 2, form the multi-film structure of the hybrid phase-shift mask. According to the embodiment, the multi-film structure can be distinguished into periphery area 100 and cell area 200. In cell area 200, the transparent film 4 comprises a first transparent region T1; trenches of the transparent film 4 constitute a second transparent region T2, next to the first transparent region T1 and along the x-coordinate. Therefore, the light source transmits through the first and second transparent region, T1 and T2, will cause a phase difference between the two regions, and the difference is chosen to substantially equal to 180 degrees. Accordingly, the light source, transparent through T1 and T2, is overlapped with each other at edge portion of the exposure pattern, and the overlapped light source will cancel each other because of the phase difference. The contrast at the edge portion will be enhanced, and thus the resolution can also be enhanced. Referring to FIG. 1B, a first shading region B1, constituted by the opaque film 2 and the underlying attenuated film 3 and transparent film 4, is disposed next to the first transparent region T1 along the y-coordinate. The first shading region B1 can increase the contrast by controlling its transmittance for light source, and the resolution at the edge portion of the exposure pattern can be enhanced. In sum, within the cell area, the first transparent region T1 and second transparent region T2 form the chrome-less PSM features in x-coordinate, and the first transparent region T1 and first shading region B1 form the alternate PSM in y-coordinate.

Referring back to FIG. 1A, within the periphery area 100, the attenuated film 3 and the underlying transparent film 4 constitute a third transparent region T3, the transparent film 4 constitutes a fourth transparent region T4 next to the third transparent region T3, and the opaque film 2 and the underlying attenuated film 3 and transparent film 4 constitute a second shading region B2. The attenuated film 3 attenuates the intensity of the light source and yet shifts its phase by substantial 180 degrees. Accordingly, the light source transparent through T3 and T4 overlap each other at edge portion of the exposure pattern, and the overlapped light source will cancel each other because of the phase difference. Thus the third transparent region T3 and the fourth transparent region T4 constitute an attenuated PSM to enhance the contrast and resolution of the exposure pattern.

Figure 2A:
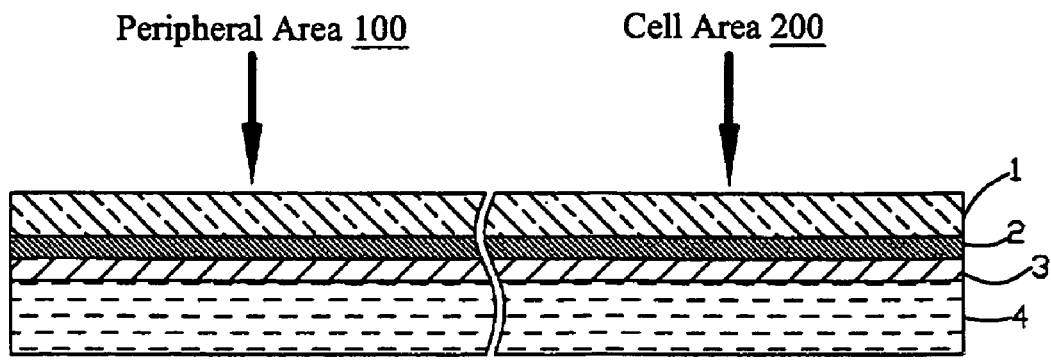
FIG. 2A-2P show the method for manufacturing the hybrid PSM according to one embodiment of the invention.
Figure 2B:
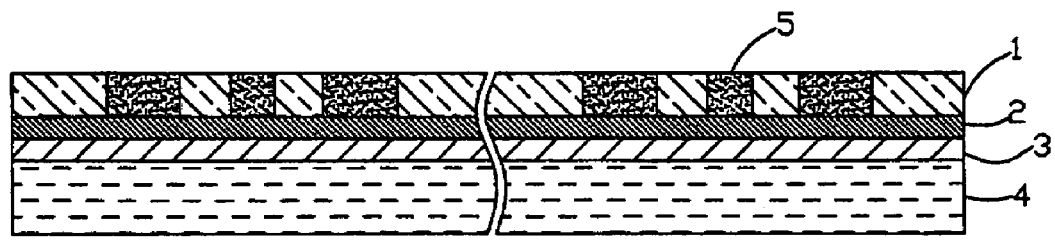
Figure 2C:
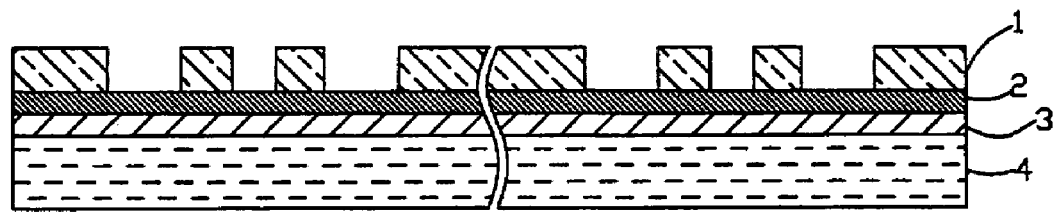
Figure 2D:
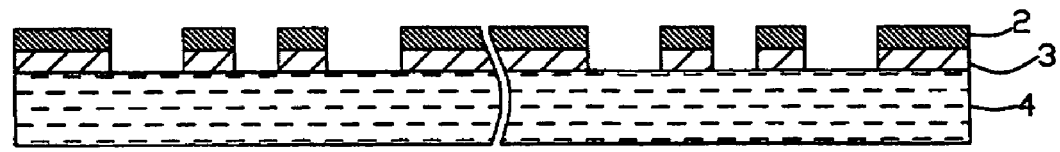
Figure 2E:
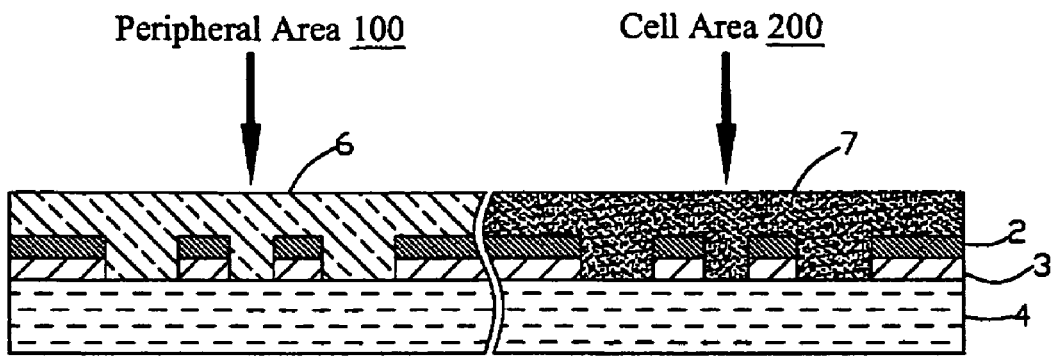
Figure 2F:
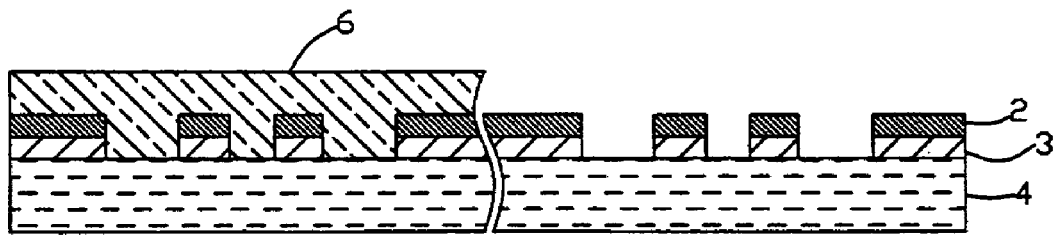
Figure 2G:
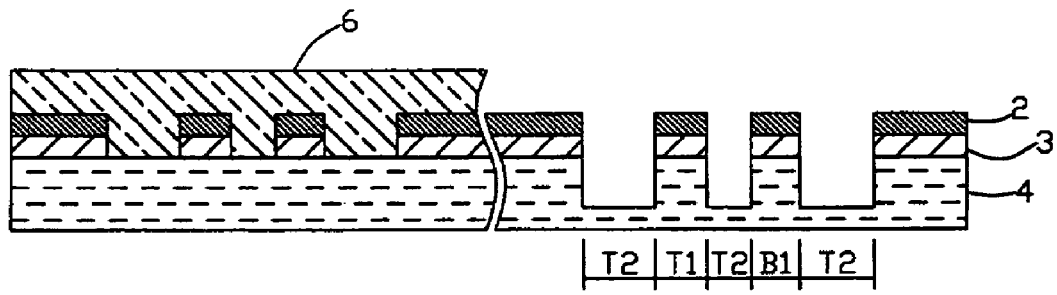
Figure 2H:
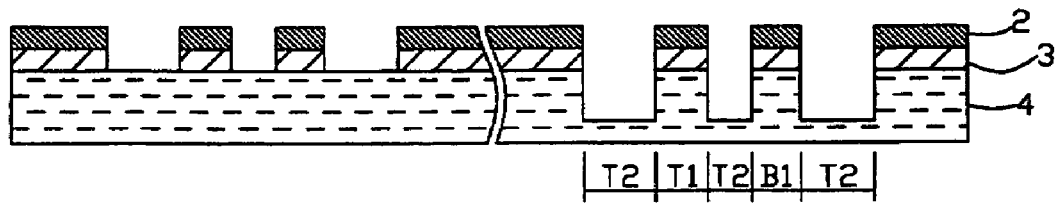
Figure 2I:
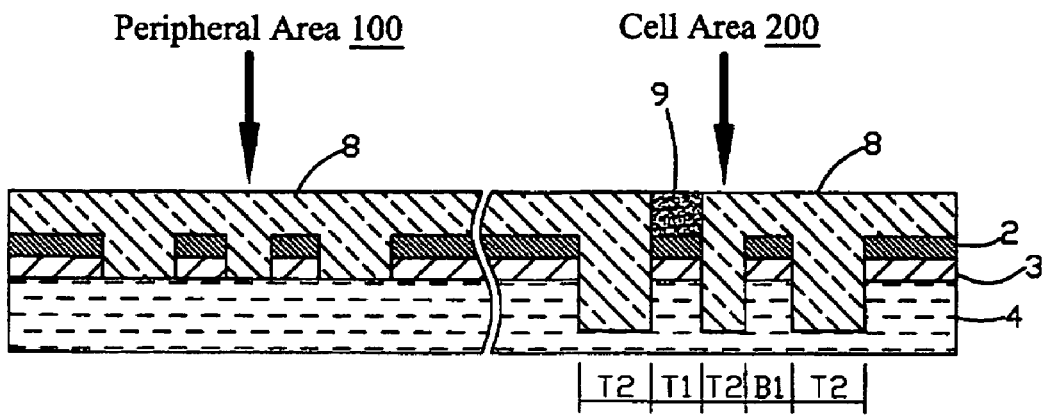
Figure 2J:
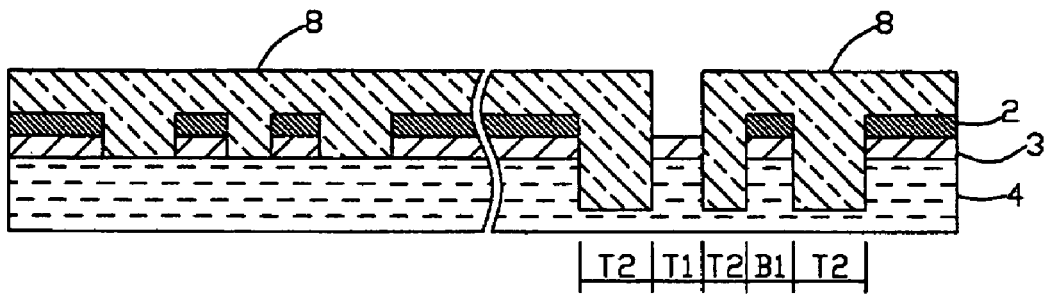
Figure 2K:
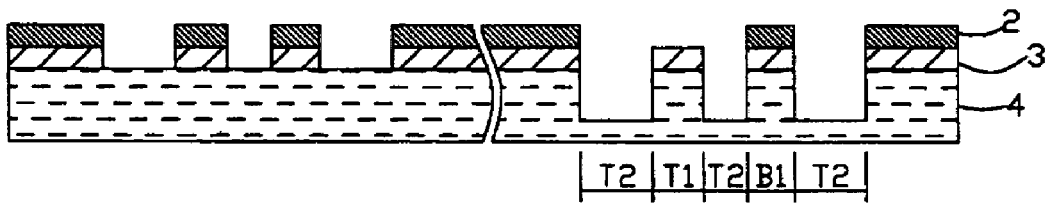
Figure 2L:
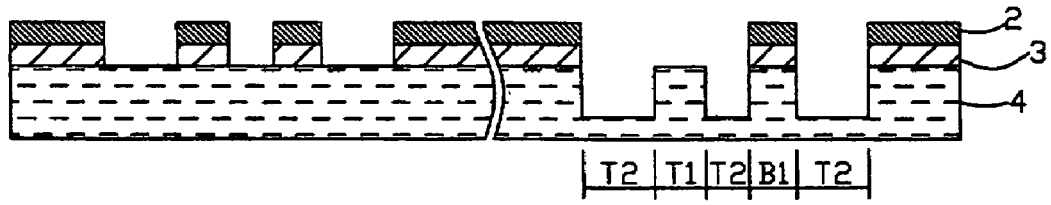
Figure 2M:
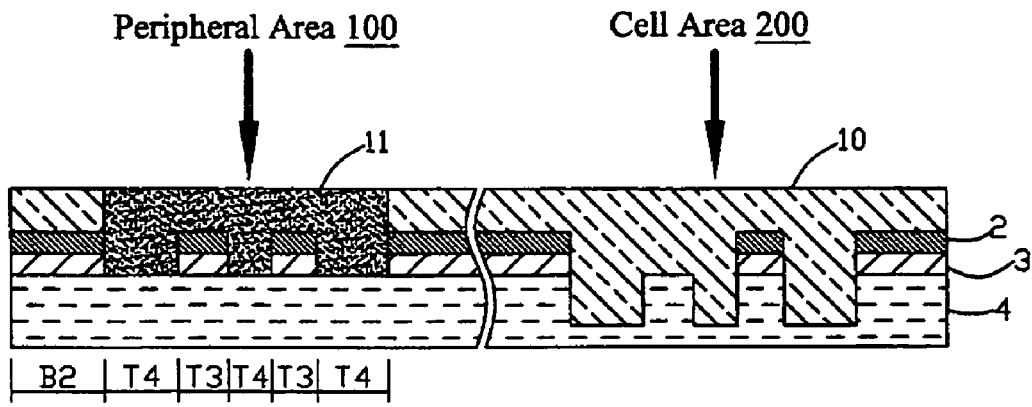
Figure 2N:
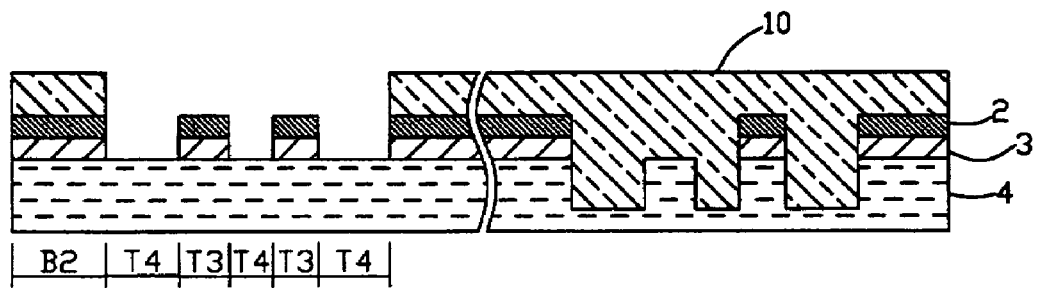
Figure 2O:
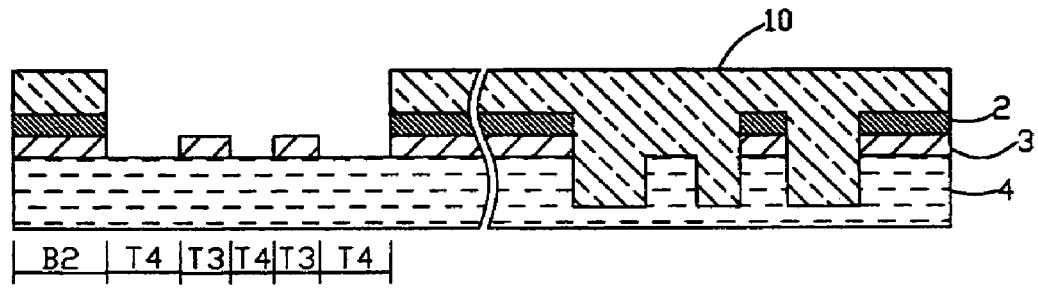
Figure 2P:
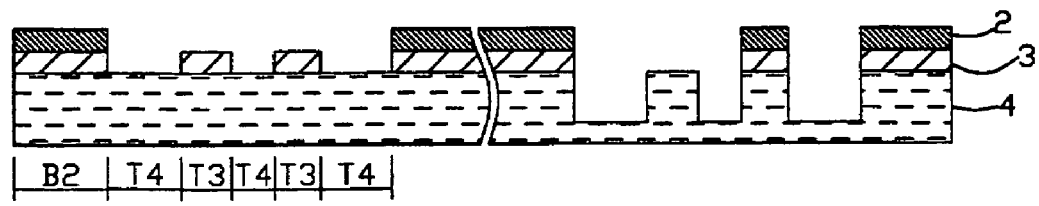

FIG. 2A-2P show the manufacturing method of the hybrid phase-shift mask according to one embodiment of the present invention. Referring to FIG. 2A, a multi-film structure is provided such that, a attenuated film 3 is formed on a transparent film 4, a opaque film 2 is formed on the attenuated film 3, and a first resist film 1 is formed on the opaque film 2.

In the manufacturing method of the embodiment, some manufacturing steps of the periphery area 100 and cell area 200, described by FIG. 2B to FIG. 2D, are the same. Referring to FIG. 2B, a first pattern 5 is written into the first resist film 1 via e-beam or any other conventional exposure processes. Referring to FIG. 2C, the first resist film 1 is patterned via any conventional develop process. Referring to FIG. 2D, by using the first resist film 1 as mask, the opaque film 2 and attenuated film 3 are etched, and then the first resist film 1 is stripped.

The manufacturing steps of the periphery area 100 and cell area 200 will be different since the step described by FIG. 2E. Referring to FIG. 2E, by using coating process or any other conventional process, a second resist film 6 is coated on the opaque film 2 within the periphery area 100 and cell area 200. Then a second pattern 7 is written into the second resist film 6 within the cell area 200 via exposure process. Referring to FIG. 2F, the second resist film 6 is patterned via the develop process, and thus the second resist film 6 remains within the periphery area 100 but not remains within the cell area 200. Referring to FIG. 2G, by using the second resist film as mask 6, the transparent film 4 within the cell area 200 is etched to form the second transparent region T2. In this step, because the opaque film 2 will also be etched simultaneously, the etching gas must be selected properly to make the etching rate of the transparent film 4 being larger than the etching rate of the opaque film 2, and the etching rate of both can be controlled. For example, according to the embodiment, the etching gas comprises $C_2F_6$, and the etching selectivity of chrome/quartz equals about 0.145. The etching rate of quartz is about 0.734 nm/sec, and the etching rate of chrome is about 0.106 nm/sec. After this step, referring to FIG. 2H, the second resist film 6 within the periphery area 100 is stripped.

Referring FIG. 2I, by using coating process or any other conventional process, a third resist film 8 is coated on the opaque film 2 within the periphery area 100 and cell area 200. By using e-beam or any other exposure process, a third pattern 9 is then written into the third resist film 8 at the region that the corresponding region of the underlying transparent film 4 is prepared for constituting the first transparent region T1. Referring to FIG. 2J, the third resist film 8 is patterned via the develop process. Then using the third resist film 8 as mask, the opaque film 2 is etched. Referring to FIG. 2K, the third resist film is stripped, the first shading region B1 being formed. Referring to FIG. 2L, using the opaque film 2 as mask, the attenuated film 3 is etched to form the first transparent region T1. After that, the second transparent region T2 is also formed, and all structures of the cell area 200 have been completed. In this step, because the attenuated film 3 (For example, MoSi layer) and the transparent film 4 (For example, quartz layer) will be etched simultaneously, the etching gas (For example, $C_2F_6$) and the power control must be properly selected, so that the etching selectivity and rate of the attenuated film 3 and the transparent film 4 can be controlled. In addition, the transparent film 4 had been etched once at prior step illustrated in FIG. 2G. That is, the transparent film 4 has been etched twice to form the second transparent region T2. Therefore, if the target depth of the trench constituting the second transparent region T2 is d, and d is equal to d1 plus d2, then the depth of the transparent film etched by step illustrated in FIG. 2G, will be chosen as d1, and the depth of the transparent film 4 etched by step illustrated in FIG. 2L, will be chosen as d2. For example, if d equals 171 nm, the transparent film 4 is etched of 161 nm at step illustrated in FIG. 2G, and the remained 10 nm is etched at step illustrated in FIG. 2L.

FIGS. 2M-2P show the manufacturing steps of the periphery area 100 of the hybrid PSM of the embodiment according to the present invention. Referring FIG. 2M, by using coating process or any other conventional process, a fourth resist film 10 is coated on the opaque film 2 within the periphery area 100 and cell area 200. Then by using exposure process, a fourth pattern 11 is written into the fourth resist film 10 within the periphery area 100. Referring to FIG. 2N, the fourth resist film 10 is patterned via the develop process. Referring to FIG. 2O, using the fourth resist film 10 as mask, the opaque film 2 within in the periphery area 100 is etched at the region that the corresponding region of the underlying attenuated film 3 is prepared for constituting the third transparent region T3, to form the third transparent region T3 and fourth transparent region T4. At the final step, referring to FIG. 2P, the fourth resist film 10 is stripped via the cleaning process to form the second shading region, and the hybrid phase-shift mask is completed.

In the embodiment, though the transparent film 4 is made of quartz based material, it may be made by other possible materials having transmittance at least 90%; though the opaque film 2 is made of chrome based material, it may be made by other possible materials having transmittance smaller than 10%; though the attenuated film 3 is made of MoSi based material, it may be made by other possible materials having transmittance between 3% and 30%. In addition, the opaque film 2, attenuated film 3, and transparent film can be a multi-film structure, such as a CrO/Cr/CrO structure of the opaque film 2. The transmittance of the attenuated film 3 is preferably between 3% and 30%. If the transmittance greater than 30%, then the underlying resist film will become thinning or even disappear. If the transmittance is smaller than 3%, then the phase shift of the light source through the attenuated film 3 cannot be obtained or the light intensity may be too weak.

The embodiment only describes the necessary (primary) steps needed to form the hybrid PSM of the present invention, but some minor steps may be omitted. For instance, after coating the third resist film 8, a conductive film may be formed on the third resist film 8 for passing a current check of the E-beam writer; After each pattern—the first 5, second 7, third 9, and fourth pattern 11—has been written, a baking process is carried out for lowering the Standing Wave Effect and supplying energy to the resist film.

Although specific embodiments have been illustrated and described, it will be appreciated by those skilled in the art that various modifications may be made without departing from the scope of the present invention, which is intended to be limited solely by the appended claims.

What is claimed is:

1. A hybrid phase-shift mask having a cell area and a periphery area, comprising:
   a transparent film;
   an attenuated film, arranged on said transparent film;
   an opaque film, arranged on said attenuated film;
   a plurality of first transparent regions, constituted by said transparent film within said cell area;
   a plurality of second transparent regions, constituted by trenches of said transparent film within said cell area, each of the plurality of the second transparent regions being arranged between every two of the plurality of first transparent regions along the x-coordinate;
   a plurality of first shading regions, constituted by patterned said opaque film and attenuated film within said cell area, and said transparent film, each of the plurality of the first shading regions being arranged between every two of the plurality of first transparent regions along the y-coordinate;
   a plurality of third transparent regions, constituted by patterned said attenuated film and transparent film within said periphery area; and
   a plurality of fourth transparent regions, constituted by said transparent film within said periphery area;
   whereby said first transparent region and second transparent region form the chrome-less phase-shift mask features in x-coordinate, and said first transparent region and first shading region form the alternate PSM in y-coordinate.

2. The hybrid phase-shift mask recited in claim 1, wherein said transparent film is made of quartz based material.

3. The hybrid phase-shift mask recited in claim 1, wherein said transparent film is made of material having transmittance greater than 90%.

4. The hybrid phase-shift mask recited in claim 1, wherein said attenuated film is made of MoSi based material.

5. The hybrid phase-shift mask recited in claim 1, wherein said attenuated film is made of material having transmittance between 3% and 30%.

6. The hybrid phase-shift mask recited in claim 1, wherein said opaque film is made of Chrome based material.

7. The hybrid phase-shift mask recited in claim 1, wherein said opaque film is made of material having transmittance smaller than 10%.

8. The hybrid phase-shift mask recited in claim 1, wherein the x-coordinate and y-coordinate as well as a z-coordinate form a Cartesian coordinate system, and said transparent film, attenuated film, and opaque film are laminated in sequence along the z-coordinate.

9. A method for manufacturing a hybrid phase-shift mask having a periphery area and a cell area, comprising the steps of:
   providing a transparent film;
   forming an attenuated film on said transparent film;
   forming an opaque film on said attenuated film;
   forming a first resist film on said opaque film;
   patterning said first resist film;
   etching said opaque film and said attenuated film, by using said first resist film as mask;
   stripping said first resist film;
   forming a second resist film on said opaque film;
   patterning said second resist film, then stripping said second resist film within the cell area;
   using said second resist film as mask within the cell area, etching said transparent film for removing a first part needed to constitute a plurality of second transparent regions;
   stripping said second resist film;
   forming a third resist film on said opaque film;
   patterning said third resist film within the cell area, exposing a region of said opaque film that its corresponding region of said transparent film is prepared for constituting a plurality of first transparent regions;
   using said third resist film as mask within the cell area, etching the exposed region of said opaque film;
   stripping said third resist film, forming a plurality of first shading regions within the cell area;
   using said opaque film as mask within the cell area, etching part of said attenuated film that its corresponding region of said transparent film is prepared for constituting the plurality of first transparent regions, and etching simultaneously said transparent film for removing a second part needed to constitute the plurality of second transparent regions, thus forming the plurality of first transparent regions and the plurality of second transparent regions after the etching step is completed;
   forming a fourth resist film on said opaque film;
   patterning said fourth resist film;
   using said fourth resist film as mask within the periphery area, etching part of said opaque film that its corresponding region of said attenuated film is prepared for constituting a plurality of third transparent regions, thus forming the plurality of third transparent regions and a plurality of fourth transparent regions after the etching step is completed; and
   stripping said fourth resist film, forming a plurality of second shading regions.

10. The method recited in claim 9, wherein the plurality of second transparent regions is formed when etching said transparent film for removing the first part and second part is completed.

11. The method recited in claim 9, wherein said transparent film is made of quartz based material.

12. The method recited in claim 9, wherein said transparent film is made of material having transmittance greater than 90%.

13. The method recited in claim 9, wherein said attenuated film is made of MoSi based material.

14. The method recited in claim 9, wherein said attenuated film is made of material having transmittance between 3% and 30%.

15. The method recited in claim 9, wherein said opaque film is made of chrome based material.

16. The method recited in claim 9, wherein said opaque film is made of material having transmittance smaller than 10%.

* * * * *